United States Patent
Newman et al.

(10) Patent No.: US 6,225,685 B1
(45) Date of Patent: May 1, 2001

(54) LEAD FRAME DESIGN FOR REDUCED WIRE SWEEP HAVING A DEFINED GAP BETWEEN TIE BARS AND LEAD PINS

(75) Inventors: Robert Newman; Chu-Chung Stephen Lee, both of Santa Clara; Melissa Siow-Lui Lee, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/543,355

(22) Filed: Apr. 5, 2000

(51) Int. Cl.[7] .................................................. H01L 23/495
(52) U.S. Cl. ........................ 257/666; 257/670; 257/671; 257/672; 257/673; 257/676
(58) Field of Search .................................. 257/670–673, 257/676, 666

(56) References Cited

U.S. PATENT DOCUMENTS

| 3,947,867 | 3/1976 | Duffek et al. . |
| 4,331,740 | 5/1982 | Burns . |
| 5,168,368 | 12/1992 | Gow, III et al. . |
| 5,245,214 | 9/1993 | Simpson . |
| 5,309,016 | 5/1994 | Kasai et al. . |
| 5,355,018 | 10/1994 | Fierkens . |
| 5,468,993 | 11/1995 | Tani . |
| 5,610,437 | * 3/1997 | Frechette ............................. 257/670 |
| 6,075,281 | * 6/2000 | Liao et al. ........................... 257/666 |

FOREIGN PATENT DOCUMENTS

| 60-92646 | 5/1985 | (JP) . |
| 3-297163 | 12/1991 | (JP) . |

* cited by examiner

*Primary Examiner*—Fetsum Abraham
*Assistant Examiner*—Ahmed N. Sefer

(57) ABSTRACT

Wire sweep/crossing during resin molding is significantly reduced or prevented by reducing the gap spacing between corner lead pins and the tie bars of a die-attach pad. Embodiments of the present invention include spacing the tie bars from the corner lead pins by a distance no greater than about 18 mils, e.g., about 4 to 12 mils. Embodiments of the present invention also comprise a lead frame wherein the inner ends of the lead pins are arranged in a substantially planar array to define a substantially circular region surrounding the die-attach pad.

18 Claims, 4 Drawing Sheets

LEAD FRAME DESIGN FOR REDUCED WIRE SWEEP HAVING A DEFINED GAP BETWEEN TIE BARS AND LEAD PINS

FIELD OF THE INVENTION

The present invention relates to plastic packaging of integrated circuits, particularly to the design of a lead frame. The present invention is particularly applicable to plastic quad flat pack (PQFP) devices.

BACKGROUND ART

Conventional semiconductor chip or die packaging techniques comprise bonding a semiconductor chip to a die-attach pad secured by tie bars and then sealing by synthetic resin molding, whereby the resulting semiconductor device or package is formed. As the geometry of transistors continues to plunge into the deep sub-micron regime, plastic packaging of integrated circuits presents greater challenges to manufacturers. The reduction in the transistor size results in a smaller die with a reduced perimeter around its edges for securing bond pads which provide input/output connections to external circuitry. Each bond pad on the die is connected to an internal package lead for transferring electrical signals between the integrated circuit and external circuitry.

Conventional lead frame designs are attendant with various problems. As the geometric size of a die shrinks, at least three problems are exacerbated. Firstly, as the die shrinks in size, there is less perimeter around the die, resulting in tighter bond pad pitch. To accommodate this tighter bond pad pitch, finer diameter bond wires are conventionally used, e.g., down to about 0.9 mil. However, finer diameter wires tend to sweep to a greater degree than thickner wires during molding, thereby generating greater shorts. Secondly, there are manufacturing limits to the minimum lead frame pitch at a given lead width. Accordingly, as the die is reduced in size, the lead fingers cannot be moved proportionately, thereby resulting in longer wires. Longer wires are more vulnerable to sweep than shorter wires, thereby increasing shorts. The phenomenon known as wire sweep occurs in packaging integrated circuit devices and is particularly acute at the corner of a die because the distance between each of the corners of a polygonal lead frame and an adjacent bonding pad on the circuit chip tends to be the longest.

Conventional approaches to minimizing wire sweep and crossing involve increasing the bond pad pitch proximate the corners of the die-attach pad. However, greater bond pad pitch proximate the corners increase the dimensions of the chip, thereby increasing manufacturing costs. Another conventional approach is to shorten the bond wires by reducing the width of a metal lead. This approach, however, compromises the overall yield of wire bonding semiconductor chips and increases lead frame manufacturing costs.

Accordingly, there exists a need for a lead frame design that minimizes or eliminates electrical shorting, particularly due to mold sweep. There exists a particular need for such a lead frame design suitable for use with a submicron integrated circuit die.

DISCLOSURE OF THE INVENTION

An advantage of the present invention is a lead frame design that eliminates or substantially reduces wire sweep and wire crossing, i.e., short circuiting.

Additional advantages and other features of the present invention will be set forth in part in the description that follows and in part will become apparent to those having ordinary skill in the art upon examination of the following disclosure or may be learned from the practice of the present invention. The advantages of the present invention may be realized and obtained as particularly pointed out in the appended claims.

According to the present invention, the foregoing and other advantages are achieved in part by a lead frame for an integrated circuit, the lead frame comprising: a die-attach pad for supporting a semiconductor die thereon; a plurality of lead pins with inner ends arranged in an array to define a central region surrounding the die-attach pad; and a plurality of tie bars for supporting the die-attach pad, the tie bars extending from the die-attach pad between lead pins to form a gap between a tie bar and a lead pin; wherein the gap is no greater than about 18 mils.

Embodiments of the present invention comprise a substantially polygonal shaped die-attach pad having four corners and a tie bar extending from each corner. Embodiments of the present invention also comprise controlling the gap between each tie bar and a lead pin to no greater than about 15 mils, such as less than about 10 mils. Embodiments of the present invention also comprise a lead frame wherein the inner ends of the lead pins are arranged in a substantially planar array to define a substantially circular central region surrounding the dieattach pad.

Additional advantages of the present invention will become readily apparent to those having ordinary skill in the art from the following detailed description, wherein the embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

The present invention addresses and solves the shorting problem stemming from wire crossing, particularly during resin molding semiconductor packages, most particularly in semiconductor packages involving miniaturized semiconductor dies. During extensive experimentation and investigation, it was found that such wire crossing and, hence, shorting, is primarily due to wire sweep during resin molding. Upon further experimentation and investigation it was found that a significantly large gap is typically formed between the corner tie bars and lead pins of a conventional lead frame, e.g., greater than about 40 mils. It is believed that the wire sweep problem is caused by turbulence of the mold compound flow during molding. Experimentation was then conducted on techniques to reduce the turbulence of the mold compound flow. As a result of such experimentation, it was found that a reduction in the gap spacing between the tie bars and lead pins resolved this issue.

Figure 1:
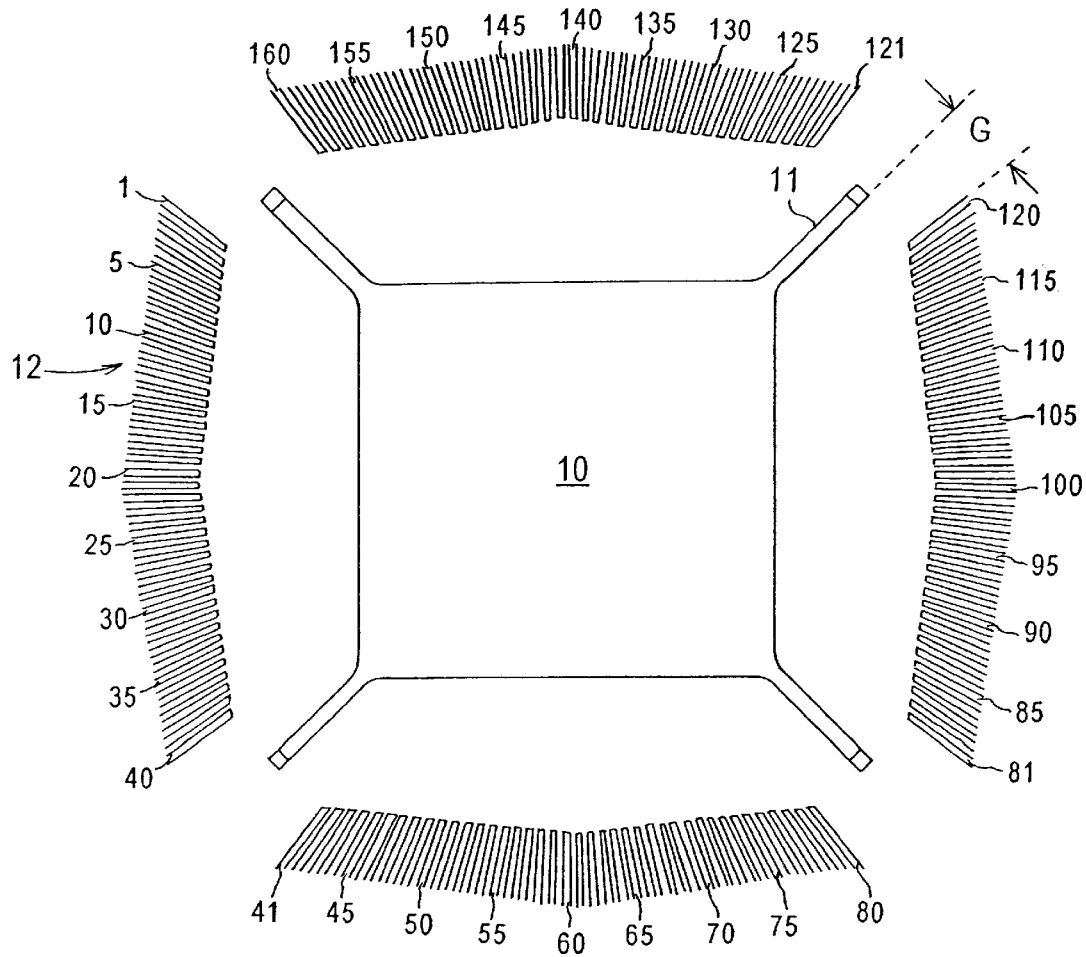
FIG. 1 schematically illustrates a conventional lead frame design.

A conventional lead frame design is depicted in FIG. 1 and comprises a die-attach pad 10, generally of a square shape, with tie bars 11 extending from each of the four corners of die-attach pad 10. The lead frame comprises a plurality of lead pins 12, numbered 1 through 160, with separations at each corner to accommodate the tie bars 11 generating a gap G between a tie bar and a lead pin of about 40 mils or greater. It was found that a reduction in the gap between the tie bars and lead pins significantly reduced and in many cases eliminated wire sweep, thereby significantly reducing or eliminating shorting due to crossed wires during resin molding.

Embodiments of the present invention, therefore, comprise reducing the gap between a tie bar and a lead pin to no greater than about 18 mils, such as no greater than about 15 mils, e.g., no greater than about 10 mils. A suitable range for the gap between the tie bar and lead pin is about 4 mils to about 12 mils. Embodiments of the present invention are applicable to any or various shaped die-attach pads, such as various polygonal shaped pads, e.g., rectangular and square shaped die-attach pads having four corners and a tie bar extending from each of the corners.

Figure 2:
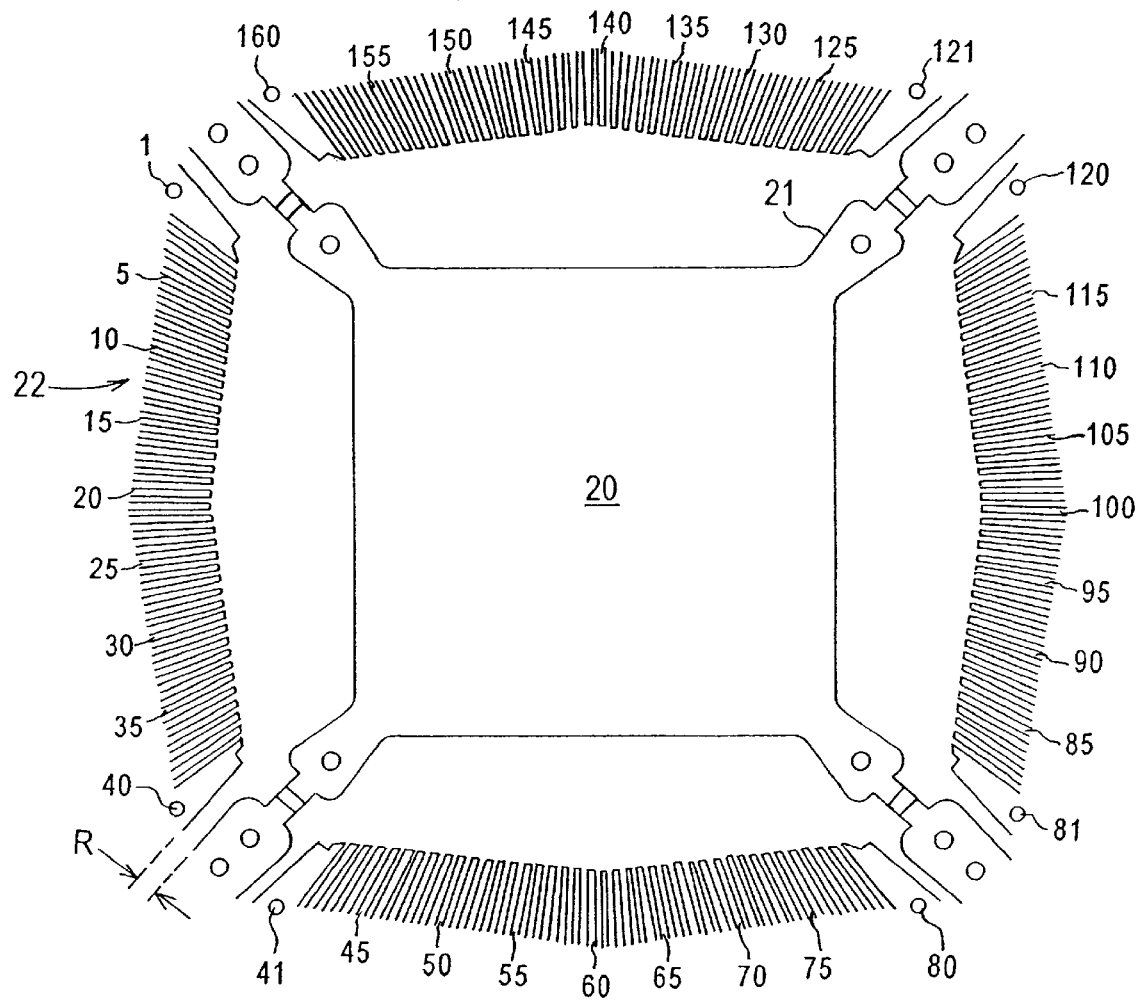
FIG. 2 schematically illustrates a lead frame design in accordance with an embodiment of the present invention.

An embodiment of a lead frame according to the present invention is schematically illustrated in FIG. 2 and comprises a substantially square die-attach pad 20 with tie bars 21 extending from the four corners thereof which tie bars 21 are relatively wide to occupy more space at the corners between the lead pins, thereby reducing the gap R between the tie bars and lead pins. In accordance with embodiments of the present invention, R is no greater than about 18 mils, such as no greater than about 15 mils, e.g., no greater than about 10 mils.

It was also found that wire sweep can be virtually eliminated by providing a circular lead frame design, wherein the inner ends of the lead pins are arranged in a substantially planar array to define a substantially circular central region surrounding the die-attach pad. The lead pins typically have outer ends disposed in non circular array with transitions to radial orientation proximate the inner ends thereof occurring intermediate the inner and outer ends.

Figure 3:
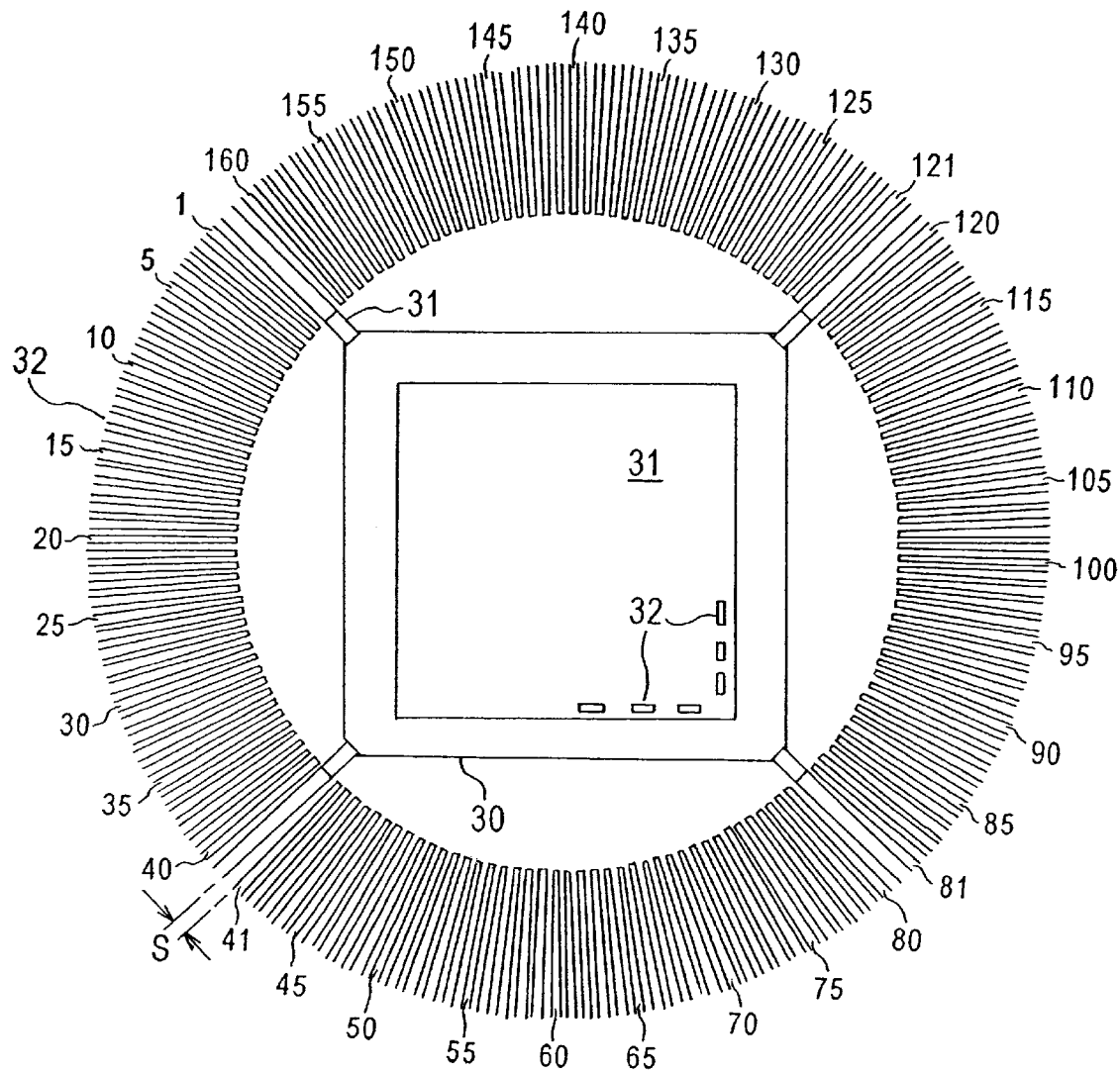
FIG. 3 schematically illustrates a lead frame design in accordance with another embodiment of the present invention.

Another embodiment of a lead frame according to the present invention is schematically illustrated in FIG. 3 and comprises a substantially square shaped die-attach pad 30 with tie bars 31 extending from the corners thereof. The lead frame design depicted in FIG. 3 comprises a plurality of lead pins 32 arranged to define a substantially central circular region about die-attach pad 30.

In the circular lead frame design, the inner lead pins of the circumference of a circle result in a reduced distance from the lead pins to the bond pads at the corners of the die. Each of the lead pins connects to a corresponding bond pad on a semiconductor die through a bond wire. Since the lead pins are arranged in a substantially geometric circular shape, the width of the metal leads required along the circumference of the circular lead frame do not differ as much as with other geometric shapes for lead frames.

Circular lead frames, in effect, permit shorter wires to wire bond to the four corners of a semiconductor die and to the corresponding lead tips of the circular lead frame. Wire sweep is, therefore, minimized by a circular lead frame design. Unlike a polygonal lead frame, the short wires from the corner of the die to the lead frame are less likely to touch adjacent wires, thereby reducing electrical shorts in the packaged integrated circuit. The use of a circular lead frame design minimizing wire sweep enables a further reduction in the pitch between the bond pads on an integrated circuit die and, consequently, pad dimensions. Accordingly, a circular lead frame design is conducive to further miniaturization. In U.S. patent application Ser. No. 08/590,392 (now abandoned) a circular lead frame design is disclosed.

Adverting to FIG. 3, the inner ends of the lead pins 32 form a substantially geometric circular cavity in the center of the lead frame and are aligned substantially along radii from the center of the circular region. Thus, the metal lead pins 32 are oriented along radial courses near the inner ends and near non-radial courses near the outer ends, with transitions in courses occurring through transition regions intermediate the inner end and outer ends of the lead pins. The circular cavity provides a framework to wire bond the inner ends of the lead pins to bond pads 32 on semiconductor die 31. The die-attach pad 30 can be adhesively attached beneath the lead pins in a conventional manner, e.g., as a heatspreader or heatsink, via an insulating layer to support a semiconducted die thereon and to aid in retaining the inner ends of the lead pins in fixed positions.

When a heatspreader is attached to a lead frame then the critical gap is not the "tiebar gap" but rather slots in the heatsink and tape that allow molding compound to flow unimpeded by the heatsink. The most critical area of this gap is in the location of the heatsink that is closer to the die than the lead tips.

Figure 4:
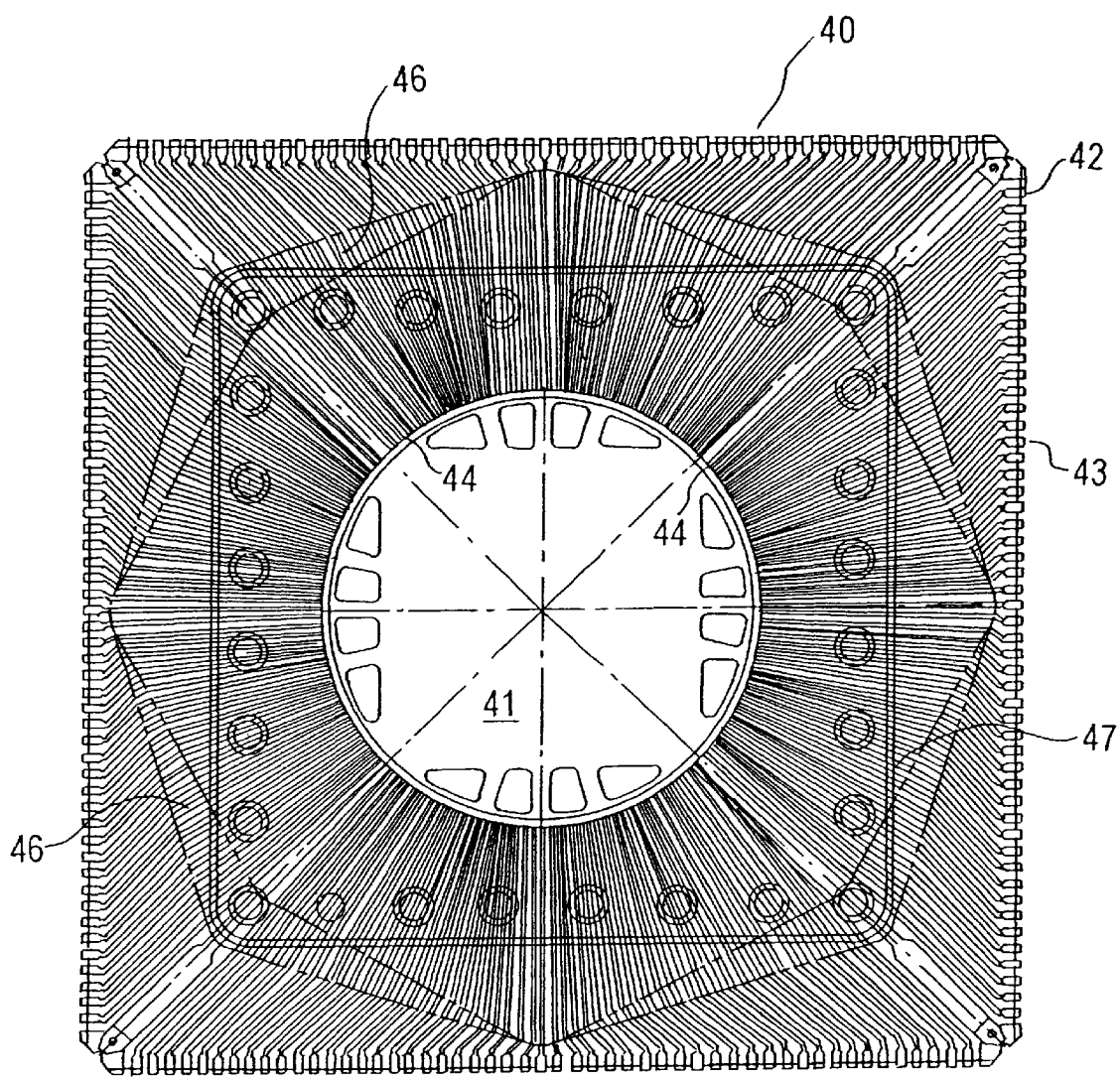
FIG. 4 schematically illustrates another embodiment of the present invention.

A circular lead frame in accordance with an embodiment of the present invention is schematically illustrated in FIG. 4. The lead frame 40 comprises of a plurality of metal leads 42 arranged adjacent to one and another in a planar array. The outer ends 43 of the metal leads from a rectangular shape for conventional plastic packaging. The inner ends 44 of the plurality of metal leads 42 form a geometric circular cavity 46 in the center of the lead frame 40, and are aligned substantially along radii from the center of the circular region. Thus, the metal leads 42 are oriented along radial courses near the inner ends 44 and along non-radial courses near the outer ends 43, with transitions in courses occurring through transition regions 46 intermediate the inner ends 44 and outer ends 43 of the metal leads 42. The circular cavity 46 provides a framework to connect the inner ends 44 to bonding pads (not shown) on a die (not shown).

An alternate manifestation contained in the concept of FIG. 4 would be the attachment of a heatspreader to a lead frame that contains a separate die attach pad. The central base of that die attach pad (not shown) would be supported relative to the lead frame by metal support bars (not shown) that are substantially evenly spaced about the cavity. That manifestation is alternate to that shown in FIG. 4 where the heatspreader serves as the die attach pad and is adhesively attached to a padless frame. In both cases the insulating adhesive layer may be disposed outwardly from the circular lead frame.

The central base or die-attach pad 41 may be supported relative to the lead frame by metal support bars (not shown) that are substantially evenly spaced about the circular cavity. Alternatively, a die-attach pad 41 may be adhesively attached beneath the leads 44 in conventional manner via an insulating layer to support a die thereon and to aid in retaining the inner lead ends 44 in fixed positions. The insulating adhesive layer may be disposed outwardly from the circular inner lead tips 44 and inwardly from the outer perimeter 47 of the die-attach pad 41. Also, a die-attach pad supported in this manner with respect to the lead frame may be formed of thick metal of substantial thermal mass to serve as a heat sink for an attached die.

The present invention provides a lead frame design that substantially reduces wire sweep and, hence, shorting of bond wires. The present invention is applicable to the manufacture of any or various type of semiconducted packaging, particular highly miniaturized semiconductor packages.

Only the preferred embodiment of the present invention and but a few examples of its versatility are shown and described in the present disclosure. It is to be understood that the present invention is capable of use and various other combinations and environments and is capable of changes or modifications within the scope of the inventive concept as expressed herein.

What is claimed is:

1. A lead frame for an integrated circuit, the lead frame comprising:
   a die-attach pad for supporting a semiconductor die thereon;
   a plurality of lead pins with inner ends arranged in an array to define a central region surrounding the die-attach pad; and
   a plurality of tie bars for supporting the die-attach pad, the tie bars extending from the die-attach pad between neighboring lead pins to form a gap between a tie bar and lead pin; wherein, the gap is no greater than about 18 mils.

2. The lead frame according to claim 1, wherein each tie bar is spaced apart from a lead pin by a gap no greater than about 18 mils.

3. The lead frame according to claim 2, wherein the gap is no greater than about 15 mils.

4. The lead frame according to claim 3, wherein the gap is no greater than about 10 mils.

5. The lead frame according to claim 1, wherein the die-attach pad has a substantially polygonal shape.

6. The lead frame according to claim 5, wherein:
   the die-attach pad comprises four corners; and
   a tie bar extends from each corner.

7. The lead frame according to claim 6, wherein the die-attach pad has a substantially square shape.

8. The lead frame according to claim 6, wherein the gap is no greater than about 15 mils.

9. The lead frame pad according to claim 8, wherein the gap is no greater than about 10 mils.

10. The lead frame according to claim 8, wherein the gap is about 4 to about 12 mils.

11. An assembly comprising:
    the lead frame according to claim 10; and
    a semiconductor die containing the integrated circuit, the die having a substantially polygonal shape and supported on the die-attach pad within the substantially circular central region.

12. The assembly according to claim 11, comprising:
    a plurality of contact pads along edges of the die; and
    a plurality of bond wires, each connecting a contact pad on the semiconductor die and inner end of one of the plurality of lead pins of the lead frame, wherein bond wires on contact pads near corners of the rectangular edges of the semiconductor die are shorter than bond wires on contact pads near the middle of an edge of the semiconductor die.

13. The lead frame according to claim 6, wherein the inner ends of the lead pins are arranged in a substantially planar array to define a substantially circular central region.

14. The lead frame according to claim 13, wherein the lead tips have outer ends disposed in a non-circular array with transitions to radial orientation proximate the inner ends thereof occurring intermediate the inner and outer ends.

15. The lead frame according to claim 14, wherein the die-attach pad is adhesively attached to the plurality of lead pins in planar orientation therewith and in electrically isolation therefrom to impart mechanical strength to the lead pins.

16. A lead frame for an integrated circuit, the lead frame comprising:
    a die attach pad for supporting a semiconductor die thereon;
    a plurality of lead pins with inner ends arranged in an array to define a central region surrounding the die-attach pad; and
    a heatspreader attached to the lead frame with adhesive insulating tape, wherein the heatspreader and tape have slots in the corner that create a corner gap not greater than 18 mils.

17. The lead frame according to claim 16, wherein the slots in the heatsink and tape are no wider than 18 mils.

18. The lead frame according to claim 17, wherein the slots are no wider than 18 mils in the area of the heatsink that is closer to the die then the lead tips.

* * * * *

UNITED STATES PATENT AND TRADEMARK OFFICE
CERTIFICATE OF CORRECTION

PATENT NO. : 6,225,685 B1  
DATED : May 1, 2001  
INVENTOR(S) : Robert Newman et al.

It is certified that error appears in the above-identified patent and that said Letters Patent is hereby corrected as shown below:

Title page,  
Item [54], change the title from "LEAD FRAME DESIGN FOR REDUCED WIRE SWEEP HAVING A DEFINED GAP BETWEEN THE BARS AND LEAD PINS" to -- LEAD FRAME DESIGN FOR REDUCED WIRE SWEEPING --.

Column 1,  
Change the title from "LEAD FRAME DESIGN FOR REDUCED WIRE SWEEP HAVING A DEFINED GAP BETWEEN THE BARS AND LEAD PINS" to -- LEAD FRAME DESIGN FOR REDUCED WIRE SWEEPING --.

Signed and Sealed this

Twenty-ninth Day of January, 2002

Attest:

*Attesting Officer*

JAMES E. ROGAN  
*Director of the United States Patent and Trademark Office*